US009128156B2

(12) United States Patent
Jardine (10) Patent No.: US 9,128,156 B2
(45) Date of Patent: Sep. 8, 2015

(54) ALTERNATOR AND STARTER TESTER WITH OTHER FAILURES DETERMINATION FUNCTIONALITY AND METHOD

(75) Inventor: Lee Jardine, Owatonna, MN (US)

(73) Assignee: Bosch Automotive Service Solutions Inc., Warren, MI (US)

( * ) Notice: Subject to any disclaimer, the term of this patent is extended or adjusted under 35 U.S.C. 154(b) by 695 days.

(21) Appl. No.: 13/463,292

(22) Filed: May 3, 2012

(65) Prior Publication Data

US 2013/0297247 A1  Nov. 7, 2013

(51) Int. Cl.
*G06F 19/00* (2011.01)
*G01R 31/34* (2006.01)
*G06F 15/00* (2006.01)

(52) U.S. Cl.
CPC ............... *G01R 31/34* (2013.01); *G06F 15/00* (2013.01)

(58) Field of Classification Search
CPC .... G01R 31/34; G01R 31/007; G01R 31/319; G01R 31/343; G06F 15/00; G06F 2203/04806; G06F 3/0481; G01M 17/00; F02N 11/10
USPC ......... 702/58, 113, 183; 73/114.59; 701/29.6, 701/32.8
See application file for complete search history.

(56) References Cited

U.S. PATENT DOCUMENTS

| | | | |
|---|---|---|---|
| 1,313,061 A | 8/1919 | Brown | |
| 2,578,694 A | 12/1951 | Goldman | |
| 3,745,456 A | 7/1973 | Kahler | |
| 3,893,029 A | 7/1975 | Vensel et al. | |
| 3,903,737 A | 9/1975 | Burden et al. | |
| 3,936,744 A | 2/1976 | Perlmutter | |
| 4,070,624 A | 1/1978 | Taylor | |
| 4,500,304 A | 2/1985 | Foster | |
| 4,641,534 A | 2/1987 | Schneider et al. | |
| 4,666,122 A | 5/1987 | Goodard | |
| 4,781,665 A | 11/1988 | Walker | |
| 4,832,666 A | 5/1989 | Henderson | |
| 4,849,665 A | 7/1989 | Kitamura et al. | |
| 4,867,427 A | 9/1989 | Cunningham | |
| 4,945,272 A | 7/1990 | Ochi et al. | |

(Continued)

FOREIGN PATENT DOCUMENTS

EP    0039122 A2    11/1981

OTHER PUBLICATIONS

International Search Report and Written Opinion dated Apr. 26, 2013 for PCT/US2013/027108 filed Feb. 21, 2013.

(Continued)

*Primary Examiner* — John H Le
(74) *Attorney, Agent, or Firm* — Baker & Hostetler LLP (57) ABSTRACT

The diagnostic tool for testing the performance of a component of a vehicle may include a processor configured to process test information from a component of the vehicle and control and activate the component of the vehicle having identification information to be tested. The diagnostic tool may also include a memory configured to store the test information of the component and software that operates the component of the vehicle. The diagnostic tool may further include an interface module configured to provide information in addition to that of the test information of the component, wherein the additional information is related to the performance of a different vehicle component from the component, and wherein the means for storing and the means for providing are in communication with the means for processing.

16 Claims, 5 Drawing Sheets

(56) References Cited

U.S. PATENT DOCUMENTS

| | | |
|---|---|---|
| 4,980,589 A | 12/1990 | Ochi et al. |
| 5,040,493 A | 8/1991 | Gajewski et al. |
| 5,125,376 A | 6/1992 | Williams et al. |
| 5,156,573 A | 10/1992 | Bytzek et al. |
| 5,195,366 A | 3/1993 | Duncan |
| 5,473,208 A | 12/1995 | Stihi |
| 5,541,840 A | 7/1996 | Gurne et al. |
| 5,550,485 A | 8/1996 | Falk |
| 5,568,916 A | 10/1996 | Gibbons et al. |
| 5,689,517 A | 11/1997 | Ruparel |
| 5,701,089 A | 12/1997 | Perkins |
| 5,705,870 A | 1/1998 | Thomsen et al. |
| 5,718,196 A | 2/1998 | Uchiyama et al. |
| 5,816,568 A | 10/1998 | Fox |
| 5,938,169 A | 8/1999 | Ogawa et al. |
| 6,009,363 A | 12/1999 | Beckert et al. |
| 6,026,461 A | 2/2000 | Baxter et al. |
| 6,147,426 A | 11/2000 | Lepi et al. |
| 6,175,789 B1 | 1/2001 | Beckert et al. |
| 6,181,922 B1 | 1/2001 | Iwai et al. |
| 6,226,305 B1 | 5/2001 | McLoughlin et al. |
| 6,276,194 B1 | 8/2001 | Vinton et al. |
| 6,292,931 B1 | 9/2001 | Dupenloup |
| 6,304,012 B1 | 10/2001 | Chen et al. |
| 6,304,016 B1 | 10/2001 | Frederick et al. |
| 6,394,250 B1 | 5/2002 | Ouchi |
| 6,466,025 B1 | 10/2002 | Klang |
| 6,480,723 B1 | 11/2002 | Davidson et al. |
| 6,553,039 B1 | 4/2003 | Huber et al. |
| 6,634,896 B1 | 10/2003 | Potega |
| 6,647,027 B1 | 11/2003 | Gasparik et al. |
| 6,674,046 B2 | 1/2004 | Bankstahl et al. |
| 6,687,263 B2 | 2/2004 | van Oldenborgh et al. |
| 6,704,829 B1 | 3/2004 | Hoshi et al. |
| 6,738,696 B2 | 5/2004 | Oi |
| 6,777,945 B2 | 8/2004 | Roberts et al. |
| 6,791,332 B2 | 9/2004 | Raichle |
| 6,803,748 B2 | 10/2004 | Peter |
| 6,834,631 B1 | 12/2004 | Blackburn et al. |
| 6,895,809 B2 | 5/2005 | Raichle |
| 6,986,292 B2 | 1/2006 | Kemnade |
| 7,134,325 B2 | 11/2006 | Krampitz et al. |
| 7,150,186 B2 | 12/2006 | Murphy et al. |
| 7,152,464 B2 | 12/2006 | Krampitz et al. |
| 7,212,911 B2 | 5/2007 | Raichle et |
| 7,246,015 B2 | 7/2007 | Bertness et al. |
| 7,472,820 B2 | 1/2009 | Krampitz et al. |
| 7,640,795 B2 | 1/2010 | Raichle |
| 7,690,573 B2 | 4/2010 | Raichle et al. |
| 7,696,759 B2 | 4/2010 | Raichle et al. |
| 2002/0056056 A1 | 5/2002 | Bannatyne et al. |
| 2002/0077781 A1* | 6/2002 | Liebl et al. ............ 702/183 |
| 2004/0104728 A1 | 6/2004 | Bertness et al. |
| 2004/0163501 A1 | 8/2004 | Chen |
| 2004/0227523 A1 | 11/2004 | Namaky |
| 2004/0251907 A1 | 12/2004 | Kalley |
| 2005/0088304 A1 | 4/2005 | Hines et al. |
| 2005/0174292 A1 | 8/2005 | McFarland et al. |
| 2006/0119365 A1 | 6/2006 | Makhija |
| 2006/0136119 A1* | 6/2006 | Raichle et al. ............ 701/114 |
| 2007/0152702 A1 | 7/2007 | Raichle et al. |
| 2007/0294001 A1 | 12/2007 | Underdal et al. |
| 2008/0249681 A1 | 10/2008 | Bertosa et al. |
| 2009/0300257 A1 | 12/2009 | Vossen |
| 2010/0170944 A1 | 7/2010 | Raichle et al. |
| 2011/0015823 A1 | 1/2011 | Bertosa et al. |

OTHER PUBLICATIONS

International Search Report and Written Opinion dated Feb. 26, 2014 for PCT/US2013/060127 filed Sep. 17, 2013.

\* cited by examiner

ALTERNATOR AND STARTER TESTER WITH OTHER FAILURES DETERMINATION FUNCTIONALITY AND METHOD

FIELD OF THE DISCLOSURE

The present invention pertains to the field of testing vehicle motor rotary accessory devices. More particularly, the present invention relates to a device for testing the alternator and/or starter components of a motor vehicle engine or the like.

BACKGROUND OF THE DISCLOSURE

It is well known in the vehicle industry to employ analytical tools in connection with the analysis of vehicle motors and their individual components and systems. Two such engine components that are often analyzed are the alternator and the starter. Alternators are used in connection with an engine and are typically belt driven by the engine. Alternators have internal components, which when rotated supply electrical power to a vehicle and/or an engine. Alternators are typically removable but oftentimes rigidly mounted via a bracket to the engine block or the chassis of the vehicle. In many cases, where a standard type of alternator mounting arrangement is used, the alternator has "ears" with holes that are mounted onto a post or bolt attached to the vehicle. This permits pivoting of the alternator so that the alternator can be pivoted around the post against the belt tension in order to install and remove belts, and provide a suitable tension when the belt is installed.

Starters or starter motors are electrical motors, which typically can be removed but rigidly mounted to an engine or transmission casing. The starter motor has an electrically driven pinion gear extending from the starter motor that engages a component (typically gears on the flywheel of the engine) in order to rotate the crankshaft of the engine to start it. There is a wide range of attachment mechanisms for attaching the starter motor.

It is often desirable to test alternators and/or starter motors after removal from a vehicle at a parts supply sales location or at a repair facility. For example, such testing may be desirable for an existing alternator or starter motor before installing a new alternator and/or new starter motor. In the event that the existing alternators and/or the starter motors may pass the test, a user may eliminate that the alternators and/or the starter motors as the cause of a problem with the vehicle. However, upon eliminating the starter and/or alternator as the cause of the malfunction, the end user may desire to test other engine components to determine proper cause of the problem with the vehicle. Thus, a need exists for determining other causes of a problem once the alternators and/or the starter motors are determined to be functioning properly. Also, a need exists for identifying other components that may cause the problem once the alternators and/or the starter motors are determined to be functioning properly.

SUMMARY OF THE DISCLOSURE

The foregoing needs are met, to a great extent, by the present disclosure, wherein in one aspect, a diagnostic tool and a diagnostic method are provided that in some embodiments an alternator and starter motor tester that may provide other causes of failure when tested components pass the test.

In an exemplary embodiment, the diagnostic tool for testing the performance of a component of a vehicle may include a processor configured to process test information from an alternator component of the vehicle and control and activate the alternator component of the vehicle having identification information to be tested. The diagnostic tool may also include a memory configured to store the test information of the alternator component and software that operates the alternator component of the vehicle. The diagnostic tool may further include an interface module configured to provide information in addition to that of the test information of the alternator component, wherein the additional information is related to the performance of a different vehicle component from the alternator component, and wherein the memory and the interface module are in communication with the processor.

In another exemplary embodiment, the diagnostic tool for testing the performance of a component of a vehicle may include a processor configured to process test information from a starter motor component of the vehicle and control and activate the starter motor component of the vehicle having identification information to be tested. The diagnostic tool may also include a memory configured to store the test information of the starter motor component and software that operates the starter motor component of the vehicle. The diagnostic tool further include an interface module configured to provide information in addition to that of the test information of the starter motor component, wherein the additional information is related to the performance of a different vehicle component from the starter motor component, and wherein the memory and the interface module are in communication with the processor.

In an exemplary embodiment, the method of testing of a component of a vehicle may include the steps of activating an alternator component to generate test information and processing the test information from the alternator component of the vehicle. The method may also include the steps of receiving the test information associated with the alternator component of the vehicle via an input device and performing a diagnostic test on the alternator component. The method may further include the steps of receiving identification information resulting from the diagnostic test indicating pass or fail of the diagnostic test and querying for additional information regarding a different vehicle component from the alternator component based at least in part on the receipt of the pass and failure identification information. The method may furthermore include the step of receiving the additional information.

In another exemplary embodiment, the method of testing of a component of a vehicle may include the steps of activating a starter motor component to generate test information and processing the test information from the starter motor component of the vehicle and receiving the test information associated with the starter motor component of the vehicle via an input device. The method may also include the steps of performing a diagnostic test on the starter motor component and receiving identification information resulting from the diagnostic test indicating pass or fail of the diagnostic test. The method may further include the steps of querying for additional information regarding a different vehicle component from the starter motor component based at least in part on the receipt of the pass and failure identification information and receiving the additional information.

In an exemplary embodiment, the diagnostic tool for testing the performance of a component of a vehicle may include means for processing test information from an alternator component or a starter motor of the vehicle and control and activate the alternator component or the starter motor of the vehicle having identification information to be tested. The diagnostic tool may also include means for storing the test information of the alternator component or the starter motor component and software that operates the alternator component or the starter motor component of the vehicle. The diagnostic tool may further include means for providing information in addition to that of the test information of the alternator component or the starter motor component, wherein the additional information is related to the performance of a different vehicle component from the alternator component or the starter motor component, and wherein the means for storing and the means for providing are in communication with the means for processing.

There has thus been outlined, rather broadly, certain embodiments of the disclosure in order that the detailed description herein may be better understood, and in order that the present contribution to the art may be better appreciated. There are, of course, additional embodiments of the present disclosure that will be described below and which will form the subject matter of the claims appended hereto.

In this respect, before explaining at least one embodiment of the present disclosure in detail, it is to be understood that the present disclosure is not limited in its application to the details of construction and to the arrangements of the components set forth in the following description or illustrated in the drawings. The present disclosure is capable of embodiments in addition to those described and of being practiced end carried out in various ways. Also, it is to be understood that the phraseology and terminology employed herein, as well as the abstract, are for the purpose of description and should not be regarded as limiting.

As such, those skilled in the art will appreciate that the conception upon which this disclosure is based may readily be utilized as basis for the designing of other structures, methods and systems for carrying out the several purposes of the present disclosure. It is important, therefore, that the claims be regarded as including such equivalent constructions insofar as they do not depart from the spirit and scope of the present disclosure.

DETAILED DESCRIPTION OF EMBODIMENTS

The present disclosure will now be described with reference to the drawing figures, in which like reference numerals refer to like parts throughout. An embodiment in accordance with the present disclosure provides an alternator and starter tester for testing an alternator or starter motor that includes a protective hood or cover, a controller connecting an LCD touch-screen, a barcode connector, USB host and USB function connectors, an Ethernet connector, and a flash memory connector.

Figure 1:
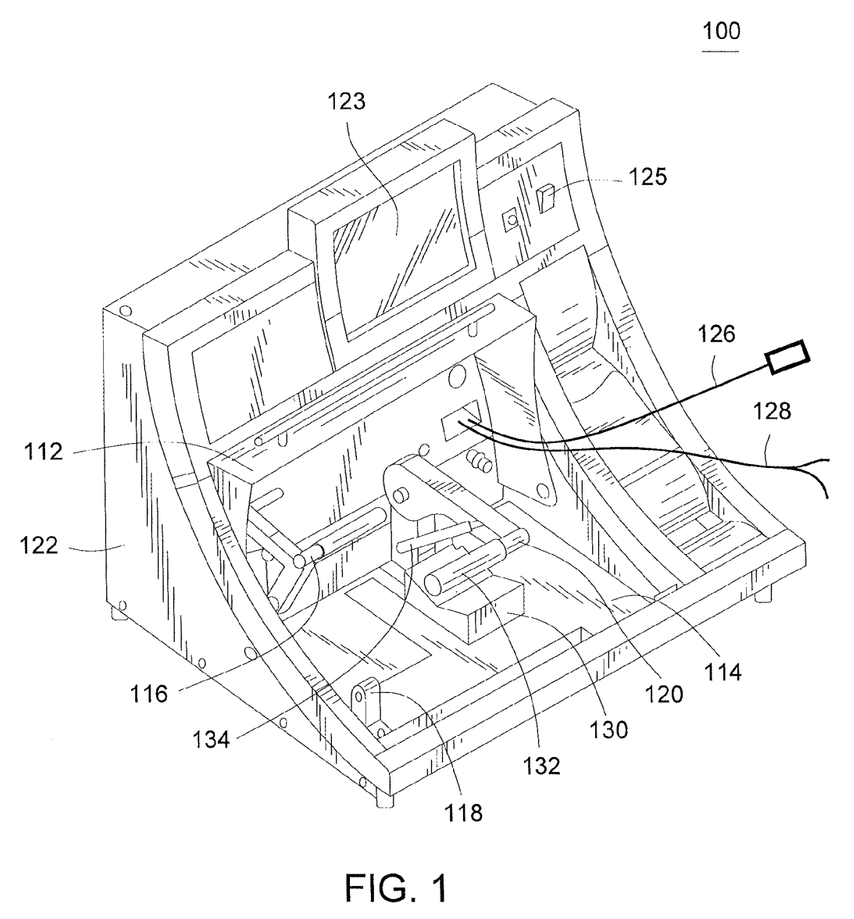
FIG. 1 is a perspective view of an alternator and starter motor tester according to an embodiment of the present invention.

An embodiment of the present testing apparatus is illustrated, in FIG. 1. FIG. 1 illustrates an alternator and starter motor tester 100 ("tester") including a housing 112 and a base plate (or chassis) 114. The housing 112 surrounds and supports various operative components of the tester 100 including, for example, a power supply, diagnostic electronics, mounting devices, a monitor screen 123, a protective door cover 122, and the like. In one embodiment, the monitor screen 123, e.g., LCD touch-screen, may be disposed within the housing 112. A test power button 125, such as a toggle-switch, is provided on the housing 112 to activate and deactivate test power to the drive motor (not shown) and/or the transformer (not shown). A main power switch (not shown) is also used to provide power to the tester 100.

The tester 100 also includes an alternator belt tensioning arrangement generally designated 116, an alternator mounting arrangement generally designated 118, and a starter motor holder arrangement generally designated as 120. Each of the belt tensioning arrangement 116, the alternator mounting arrangement 118, and the starter motor holder arrangement 120 are mounted directly to the base plate 114.

The alternator belt tensioning arrangement 116 and the mounting arrangement 118 together hold the alternator in place for testing. An installation assembly that includes one or more mounting pins (not shown) can be placed in the mounting arrangement 118 in order to mount the alternator. The alternator can be horizontally or vertically mounted depending on the type of alternator. The pins are replaceable to allow flexibility for current and future applications.

Also shown in FIG. 1, a test adapter 126 and power leads 128 can be connected to the alternator or starter motor in order to provide test information to tester 100. Additionally, a drive belt (not shown), such as a serpentine or V belt or the like, can be connected to the alternator and the drive motor to simulate the operating environment in the vehicle. A gas piston may be used for belt tension to ensure consistent belt tension during testing, thereby eliminating over tensioning or belt slippage that may affect test results.

The starter motor holder arrangement 120 includes a quick release ratchet system, wherein the starter is placed on a pad and held in place by the ratchet system. The starter motor holder arrangement 120 includes, a support pad 130, a handle 132 and a release lock 134 that when operated engages and disengages a lock (pawl, for example) from a ratchet (both not shown). The starter motor holder arrangement 120 helps to eliminate the use of straps, and alternatively uses the quick ratchet to hold the starter without the need of any additional holding mechanism or end user assistance during the test. Thus, the aforementioned arrangement makes the loading and unloading of components to be tested much more efficient. The starter motor may be placed on the support pad 130 for testing. Upon the placement, the operator squeezes the release lock and presses down on the handle 132 to engage the starter motor and then releases the lock so that the lock is again reengaged. The starter motor may be powered by a transformer (not shown) in order to simulate operating environments. The transformer may be powered by an external power source and may provide test power to the starter motor via a heavy duty cable and clamps. Power leads 128, including, for example, battery lead, ground lead, solenoid lead and sense lead are connected to the starter motor in order to conduct the tests.

FIG. 1 also illustrates the monitor screen 123 that can operate as a touch-screen LCD user interface that communicates with a controller (discussed below) as well as to display information to the end user. The present disclosure also utilizes an on-line tutorial for quickly training new personnel on the unit's functionality and on-line help screens to help new users navigate and test components during a test. The monitor screen 123 may offer step-by-step instructions for setting up the tester 100 and conducting tests. The monitor screen 123 may also display on-screen hook up diagrams and a specification library database, which eliminate the need for paper flipcharts and enables software updates for new alternator applications or starter configurations. This database can be updated by compact flash, flash drive, other memory media or remotely via a network connection (discussed below). The monitor screen 123 may allow end users to run advertising screens when the tester is not in use. These screens can be uploaded to the tester 100 from an end user's network server or uploaded from a compact flash or other memory media. Additionally, the monitor screen 123 may be capable of displaying information in various updatable languages.

The tester 100 may output "Good/Bad" or "Pass/Fail" results to the end user. An end user printout that details test results and provides technical advice for other potential problems can be provided to the end user.

Figure 2:
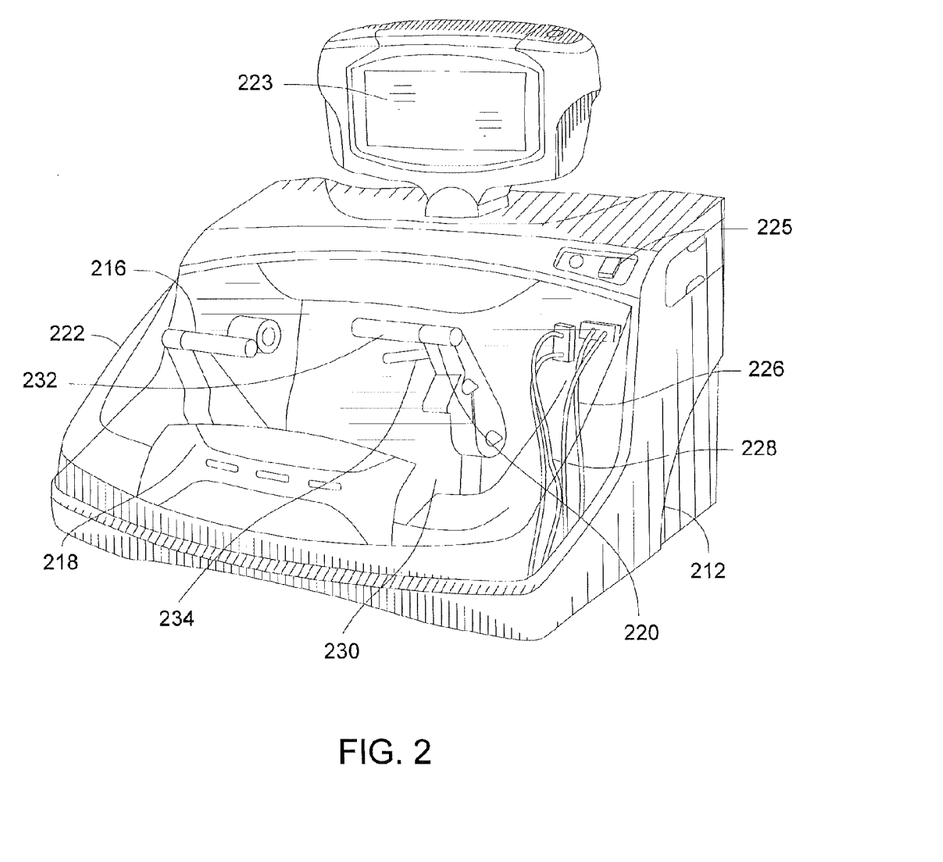
FIG. 2 is a perspective view of the alternator and starter motor tester according to another exemplary embodiment of the present invention.

Turning now to FIG. 2, a perspective view of the alternator and starter motor tester 200 according to another exemplary embodiment of the present disclosure is illustrated. The alternator and starter motor tester 200 ("tester") has components similar to the tester 100 depicted in FIG. 1, however it has an alternative design. For example, tester 200 includes a housing 212 and a base plate (or chassis) 214. The housing 212 surrounds and supports various operative components of the tester 200 including, for example, a power supply, diagnostic electronics, mounting devices, a monitor screen 223, a protective door cover 222, and the like. In the embodiment depicted, the monitor screen 223, is an LCD touch-screen disposed within the housing 212. A power button 225, such as a toggle-switch design, is provided on the housing 212 to activate or deactivate test power to the driver motor (not shown) and/or the transformer (not shown). A main power switch (not shown) is also used to provide power to the tester 200.

The tester 200 also includes an alternator belt tensioning arrangement generally designated 216, an alternator mounting arrangement generally designated 218, and a starter motor holder arrangement generally designated as 220. Each of the belt tensioning arrangement 216, the alternator mounting arrangement 218, and the starter motor holder arrangement 220 are mounted directly to the base plate 214.

The test adapters 126 and power leads 128 may be connected to the alternator or starter motor in order to provide test information to tester 200. Additionally, a drive belt (not shown), such as a serpentine or V belt or the like, can be connected to the alternator, the motor of the alternator and drive motor to simulate the operating environment in the vehicle. A gas piston may be used for belt tension to ensure consistent belt tension during testing and thereby eliminating over tensioning or slipping belts that may affect test results.

The starter motor holder arrangement 220 includes a quick release ratchet system, wherein the starter is placed on a pad and held in place by the ratchet system. The starter motor holder arrangement 220 includes, a support pad 230, a handle 232 and a release lock 234 that when operated engages and disengages a lock (pawl, for example) from a ratchet (both not shown). The starter motor holder arrangement 220 helps to eliminate the use of straps, and alternatively uses the quick ratchet to hold the starter without the need of any additional holding mechanism or end user assistance during the test. Thus, the aforementioned arrangement makes the loading and unloading of components to be tested much more efficient. The starter motor may be placed on the support pad 230 for testing. Upon the arrangement, the operator squeezes the release lock and presses down on the handle 232 to engage the starter motor and then releases the lock so that the lock is again reengaged. Power leads 228, including, for example, battery lead, ground lead, solenoid lead and sense lead are connected to the starter motor in order to conduct the tests.

In the embodiment depicted in FIG. 2, the tester 200 may incorporate enhanced safety features, such as the protective door cover 222 to enclose moving parts during tests. The protective door cover 222 conceals the belt tensioning arrangement 216, the alternator mounting arrangement 218, the starter motor holder arrangement 220, and other test components, such as an alternator or starter motor. The protective door cover 222 of the tester 200 is shown covering at least the belt tensioning arrangement 216, the alternator mounting arrangement 218, and the starter motor holder arrangement 220 in the closed position.

In the closed position, the protective door cover 222 eliminates the possibility of hands getting caught in moving parts or projectiles potentially contacting the end user. The protective door cover 222 may employ a door interlock switch (not shown) to disable tests while the protective door cover 222 is open. Alternatively, the protective door cover 222 may include a viewing window so that the operator can observe the testing components during the tests.

Figure 3:
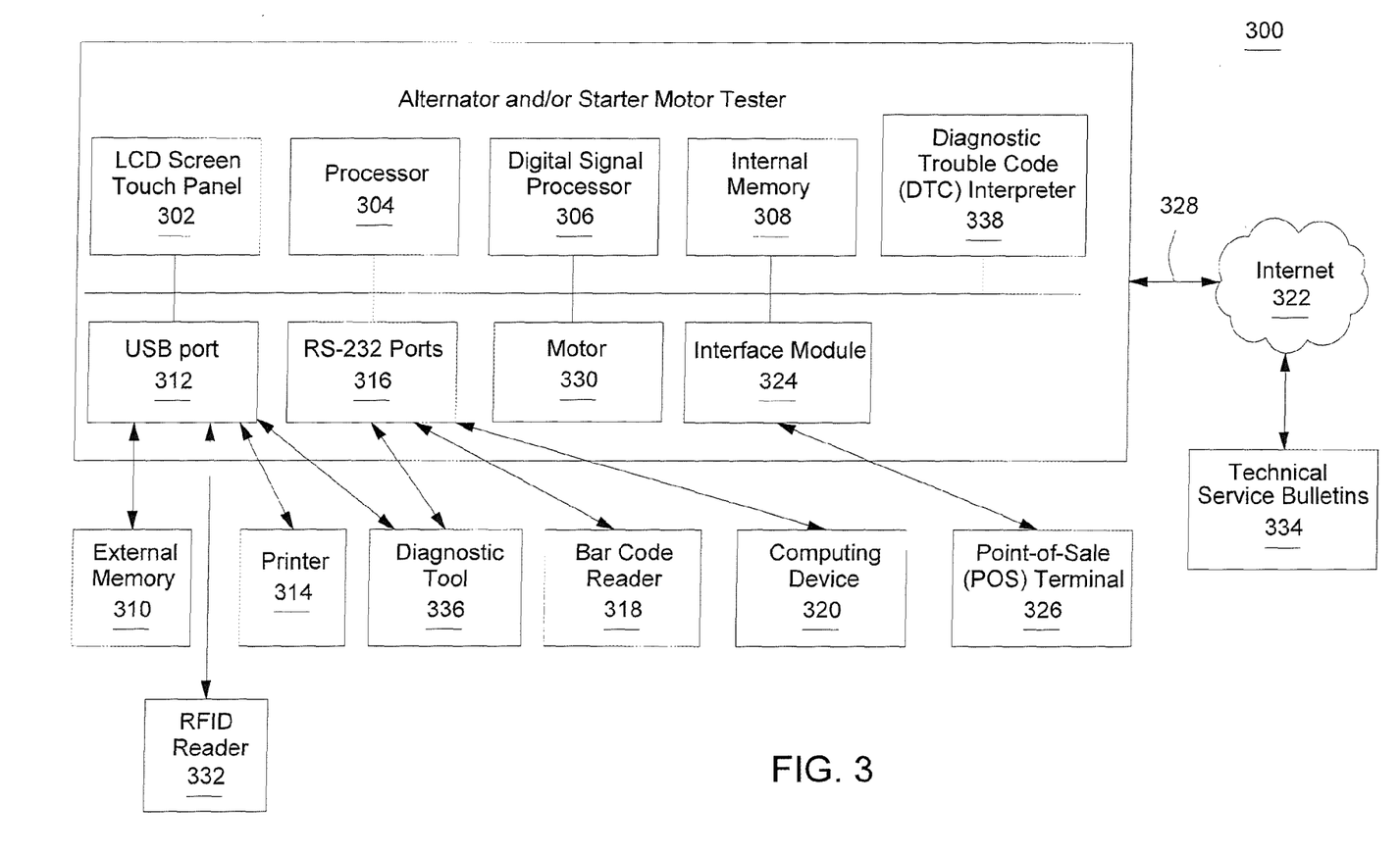
FIG. 3 is a block diagram of the components of the alternator and starter motor tester depicted in FIGS. 1-2 according to an embodiment of the present invention.

FIG. 3 is a block diagram 300 of the components of the alternator and starter motor tester as previously described and shown in FIGS. 1-2 according to an exemplary embodiment of the present invention. The components generally include a monitor screen, such as LCD screen 302 that various information to the user. The LCD screen 302 may be a touch panel to input information as desired by the user and can be controlled by a processor 304. The processor 304 may be any processor or controller, including a FPGA (Field Programmable Gate Array). The processor 304 is capable and runs various OS (Operating System) including Linux, Apple Computer's Operating System (such as OS X), Windows, Windows CE and the like. The processor 304 communicates with a digital signal processor 306, which includes an analog and digital (A/D) converter. The processor 304 communicates with other components (e.g., internal memory 308, USB port 312, RS-232 ports 316, motor 330, interface module 324 and/or diagnostic trouble code (DTC) interpreter 338) of the tester 100 via a communication bus 328.

The processor 304 is configured to communicate with an internal memory 308 and an external memory 310. The internal memory 308 and/or the external memory 310 can be any memory including, for example, compact flash, SD (secure digital), USB flash drives, and the like. A universal serial bus (USB) port 312 communicates with the processor 304 and provides a connection for various USB compatible devices, such as, for example, an external memory 310, a printer 314, a radio frequency identification (RFID) reader 332 and/or a diagnostic tool 336. The RFID reader 332 functions to read identifying information about the tested component containing an RFID chip once it is within a detection range. The RFID chip may contain information about the alternator or starter motor such as alternator/starter motor type, serial number, manufacturer, date of production or shipment, previous test results, electrical specifications, maintenance information, serial number, lot number, warranty information, a manufacture data code, method of shipment and the like.

RS-232 ports 316 also communicate with other external devices, such as a computing device 320, a bar code reader 318 and/or the diagnostic tool 336. The computing device 320 can be any computing device, including a personal computer, a laptop, a personal digital assistant (PDA), a cell phone or the like. The diagnostic tool 336 may be any computing device, such as a scan tool, code reader, a personal computer, a personal digital assistant, a cellular phone, or a notebook or any other devices that may be coupled to the vehicle (e.g., via on-board diagnostic (OBD-II) port) in order to read a diagnostic trouble code (DTC) from the vehicle.

The bar code reader 318 allows the user to scan bar code information that may be attached to the tested component or the YIN (vehicle identification number) of the vehicle from which the tested component came from. The bar code reader 318 may be, for example, a conventional optical bar code reader, such as a gun or wand type reader.

During operation, end user swipes or aims the bar code reader 318 over the bar code that is associated with the particular alternator or starter motor to be tested and reads the bar code accordingly. The bar code itself may be affixed to the alternator or starter motor at the time of manufacture, purchase, shipment or service. The bar code may contain information, or point to information stored in a database. The database may be local or remotely located and accessible by the Internet, Ethernet, Wi-Fi, LAN, Bluetooth or other wireless or a wired connection.

The bar code may provide a variety of information regarding the alternator or starter motor to be tested. For example, the bar code may provide information regarding the alternator/starter motor type, serial number, manufacturer, date of production or shipment, previous test results, electrical specifications, maintenance information, serial number, lot number, warranty information, a manufacture data code, method of shipment and the like. This data can be used to select parameters for the test cycle run to test the alternator and starter motor. The data provided by the bar code is not limited to the examples given.

In some embodiments, the printer 314 may print bar code labels that may be attached or otherwise associated with the alternator or starter motor and provides updated information about the component. The updated information may include, among other things, service dates, service procedures (including the results), and warranty information (e.g., time left on warranty, who was the original purchaser, what types of service are and are not warranted, etc.), other possible causes of problem when the alternator and starter motor pass the test, and other diagnostic procedures when the alternator and starter motor pass the test. The printed label may then be read by the bar code reader 318 in subsequent tests. These features can eliminate possible typographical errors during manual input and by speeding up part number selection and entry by having a scanning capability.

The printer 314 may print out labels regarding other possible causes of problem when the alternator and the starter motor pass the test. The printer may also print out labels regarding other possible diagnostic procedures when the alternator and starter motor pass the test. In addition, the printer 314 may print technical service bulletins (TSB) regarding other causes of problems when the alternator and the starter motor pass the test. Further, the printer 314 may print possible repairs or diagnostic solutions of problems when the alternator and the starter motor pass the test. The present disclosure also has the ability to store and display or print technical service bulletins (TSB) and/or possible repairs or diagnostic associated with specific part numbers of components to be tested. The above described generation of test results can give users access to data to assist in further analysis of causes of failures of the vehicle when the alternator and starter motor pass the test.

The processor 304 also communicates with an interface module 324. The interface module 324 communicates with other external devices or external websites, such as a technical service bulletins (TSB) 334. The interface module 324 communicates with a plurality of technical service bulletins (TSB) 334 via the Internet 322. For example, the technical service bulletins (TSB) 334 may include procedures for diagnostic and/or repairing various components of vehicles. The technical service bulletins (TSB) 334 may also include updates or upgrades of hardware and/or software of various components of vehicles. In an exemplary embodiment, the technical service bulletins (TSB) 334 are hosted by original equipment manufacturers (OEMs) or third parties. In another exemplary embodiment, the interface module 324 communicates with the technical service bulletins (TSB) 334 via the point-of-sale (POS) terminal 326.

The interface module 324 includes a database (or access the internal memory 308 or the external memory 310 that stores the database) for storing information associated with the tested components and information associated with the diagnostic test performed by the tester 100. The information associated with the tested components may include, but not limited to, alternator/starter motor type, serial number, manufacturer, date of production or shipment, previous test results, electrical specifications, maintenance information, serial number, lot number, warranty information, a manufacture data code, method of shipment and the like. The information associated with the diagnostic test performed by the tester 100 may include, but not limited to, test specification, test values, test results (including previous test results), data, time, employee, location, weather condition during testing (extreme cold or heat that may affect the test) and/or any other information associated with the diagnostic test. The interface module 324 may store a summary report of information associated with the tested components and information associated with the diagnostic tests performed by the tester 100 for a period of time.

The interface module 324 also functions to provide a summary report of information associated with the tested components and information associated with the diagnostic test performed by the tester 100 to the technical service bulletins (TSB) 334 in order to query for procedures for diagnose and/or repairs for various components of vehicles when the tested components pass the diagnostic test performed by the tester 100. In another exemplary embodiment, the interface module 324 provides the summary report of information associated with the tested components and information associated with the diagnostic test performed by the tester 100 to the technical service bulletins (TSB) 334 via the point-of-sale (POS) terminal 326.

For example, the interface module 324 encrypts the summary report transmitted to the technical service bulletins (TSB) 334 in order to maintain the integrity of the transmitted information. The interface module 324 may use various encryption algorithms to encrypt the summary report transmitted to the technical service bulletins (TSB) 334. For example, the encryption algorithms can include, but not limited to, tiny encryption algorithm (TEA), symmetric-key or asymmetric-key encryption algorithm, block encryption algorithm, steam encryption algorithm, public-key or private-key encryption algorithm, random number encryption algorithm, hash encryption algorithm, authentication code encryption algorithm or any other encryption algorithms. In another example, the interface module 324 may transmit the summary report without encryption in order to save time and bandwidth.

The interface module 324 receives data, information and/or procedures for diagnose and/or repair various components of vehicles from the technical service bulletins (TSB) 334 in response to receiving the summary report. For example, the interface module 324 compares and contrasts information associated with the tested components and information associated with the diagnostic test with information provided by the technical service bulletins (TSB) 334 in order to identify possible procedures for diagnose and/or repair various components of vehicles when the alternator and starter motor pass the test. For example, the interface module 324 may receive procedures for diagnose and/or repairing various components of vehicles that may be the cause of a failure when the tested components pass the diagnostic tests. In an exemplary embodiment, the received procedures for diagnostic and/or repairing various components of vehicles may be related to other possible causes of problems or failures when the tested components pass the diagnostic tests.

In an alternative embodiment of the present invention, the technical service bulletins (TSB) 334 may be stored in the internal memory 308 and/or the external memory 310. The interface module 324 may access the technical service bulletins (TSB) 334 stored in the internal memory 308 and/or the external memory 310. For example, the interface module 324 may access the technical service bulletins (TSB) 334 stored in the internal memory 308 and/or the external memory 310 to identify procedures for the diagnosis and/or repair of various components of vehicles that may be related to other possible causes of problems or failures when the tested components pass the diagnostic tests.

The processor 304 communicates with the diagnostic trouble code (DTC) interpreter 338. The diagnostic trouble code (DTC) interpreter 338 receives diagnostic trouble code (DTC) from the diagnostic tool 336. For example, the diagnostic trouble code (DTC) interpreter 338 receives vehicle information (make, model, year, etc.) from the diagnostic tool 336 through the USB port 312 or the RS-232 ports 316. In yet another embodiment of the present invention, the diagnostic trouble code (DTC) interpreter 338 may receive vehicle information from the bar code reader 318 and/or the RFID reader 332 to determine the diagnostic trouble code (DTC) used by the vehicle. In other exemplary embodiments, the diagnostic trouble code (DTC) interpreter 338 receives diagnostic trouble code (DTC) from the LCD screen 302. For example, a user may input the diagnostic trouble code (DTC) and/or vehicle information via the LCD screen touch panel 302. The diagnostic trouble code (DTC) and/or the vehicle information may be communicated to the diagnostic trouble code (DTC) interpreter 338 via the communication bus 328.

The diagnostic trouble code (DTC) interpreter 338 includes a database that stores information associated with the diagnostic trouble code (DTC) of various components of a vehicle. In an exemplary embodiment, the diagnostic trouble code (DTC) interpreter 338 includes a database that may store information associated with the diagnostic trouble code (DTC) of alternator and starter motor of a vehicle. The information associated with the diagnostic trouble code (DTC) includes diagnostic and/or repair information, for the diagnostic trouble code (DTC). The diagnostic and/or repair information may be specific to the vehicle or components of any vehicle based on diagnostic trouble code (DTC) or other diagnostic information. The diagnostic and/or the repair information may also be based on previous diagnostic and/or repair experience for that diagnostic trouble code (DTC) and offers various levels of reported solutions or fixes. The levels may include top reported fixes, frequently reported fixes or the like. The diagnostic and/or repair information can, be viewed via the LCD screen 302 and if available, printed by the printer 314.

The top reported fixes may include most frequently reported fixes associated with a diagnostic code. For example, the most frequently reported fix associated with an alternator may be broken engine belt. The most frequently reported fix for a starter motor may be a damaged wire. The tester 100 may determine that the alternator and the starter motor are functioning properly and may provide the top reported fixes to the user in order to assist the user to determine a problem, of the vehicle.

The processor 304 can also interact with a networked, computer, LAN (local area network), a smartphone, cellular phone or a distributed network, such as the Internet 322 and the like. This connection allows the user to update the tester 100 and also send information regarding the test results to a remote location. The information, sent or received may include, software, firmware, language and database for the components to be tested or to the tester 100. For example, the tester 100 may be periodically updated with technical service bulletins (TSB) 334, diagnostic trouble codes (DTC), and diagnostic and/or repair information associated with the diagnostic trouble codes (DTC).

As illustrated in FIG. 3, the motor 330 is provided to test the alternator components. Motor 330 can simulate the engine of a vehicle and includes a pulley to mate with a belt. During operation, the belt is coupled to the motor 330's pulley while the other end of the tester 100 is coupled to the pulley of the alternator to be tested.

Figure 4:
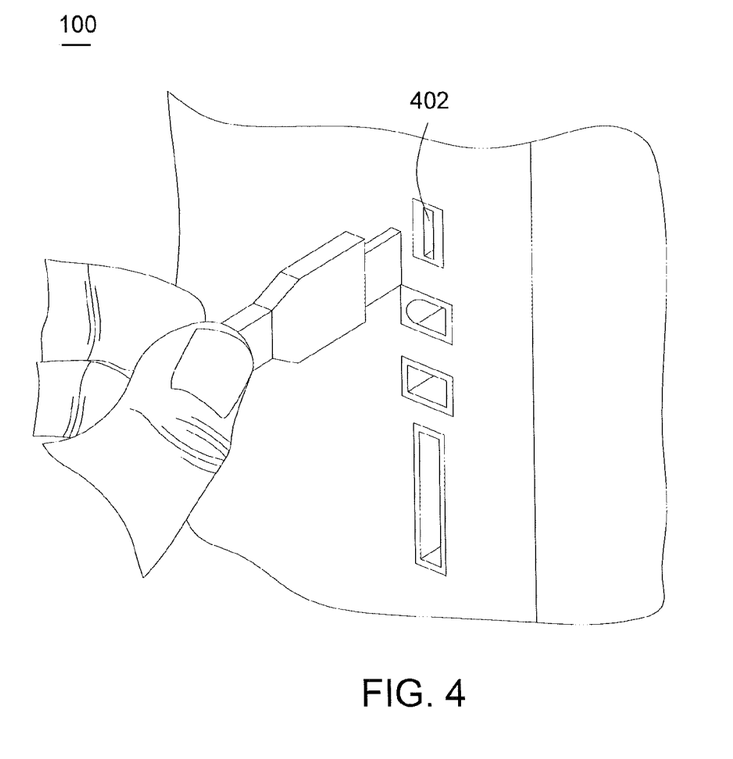
FIG. 4 is a perspective view of the peripheral and remote connections of the alternator and starter motor tester according to an exemplary embodiment of the present invention.

Turning now to FIG. 4, in some embodiments of the tester 100, network connectivity may be used to track tests based on part number, employee and/or location in order to improve and provide diagnostic or repair procedures for other components of a vehicle when the tested components pass the initial test. The large-scale communication network ports are constructed and arranged to receive an information relay device, such as an Ethernet wired module and/or an Ethernet wireless module. The Ethernet modules communicate at data rates of 10 Mbps (10Base-T Ethernet), 100 Mbps (Fast Ethernet), 1000 Mbps (Gigabit Ethernet) and other data rates. The information relayed can include data from the result of an alternator or starter motor test, the part's warranty information, the part type, the part make and model, previous tests, updates, diagnostic or operating parameters of the alternator and starter motor tester, maintenance data of the alternator and starter motor tester, and any other data required by the operator.

As depicted in to FIG. 4, the peripheral, module ports 402 are used to communicate to various peripheral devices such as a mouse, a keyboard, or the printer 314 as well as to receive updates and/or downloads from a connected computing device 320 such as a laptop or personal computer. The peripheral module port 402 is a USB module, for example, having ports for a host connection and a function connection. The USB module communicates as USB 1.1 or USB 2.0, 3.0 or other data rates. The host connection accommodates a mouse, a keyboard, or a printer. The function connection may accommodate a laptop or personal computer.

Figure 5:
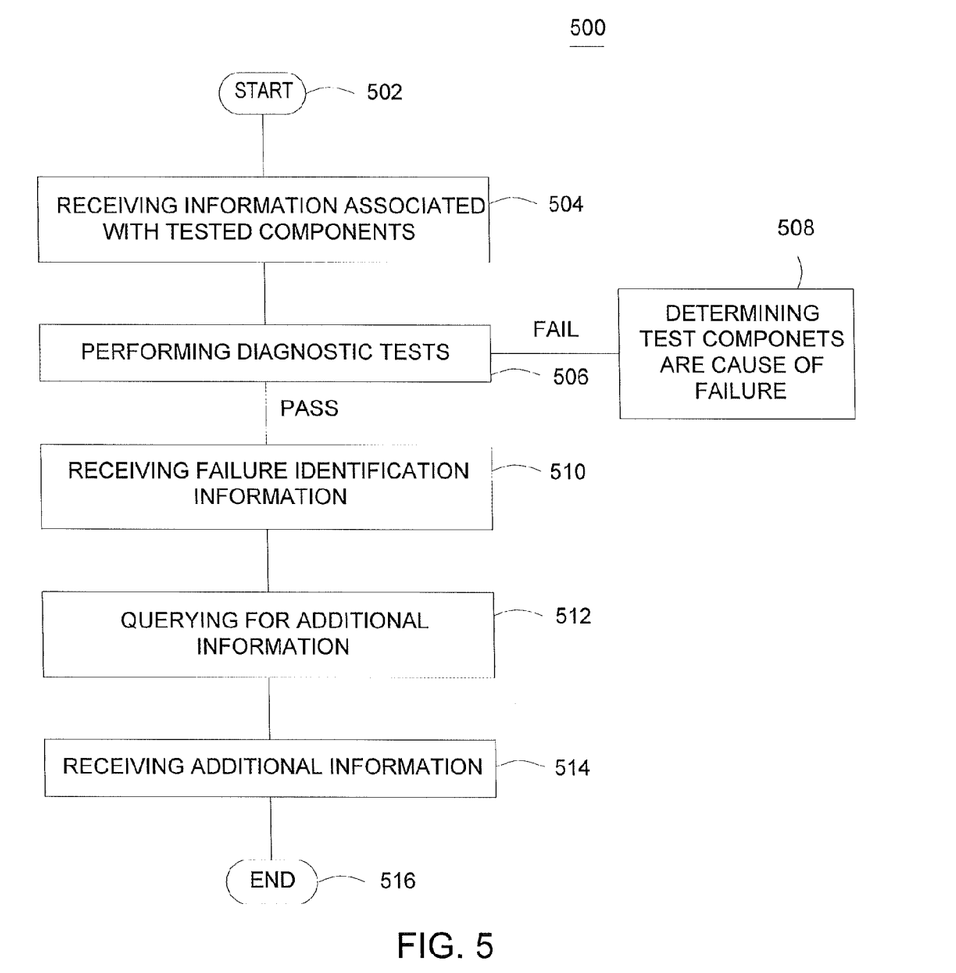
FIG. 5 is a block diagram illustrating a method for providing diagnostic or repair information for engine components according to an exemplary embodiment of the present invention.

Referring now to FIG. 5, the steps for providing diagnostic and/or repair information in addition to those tests already completed is illustrated in accordance with an embodiment of the present invention. This exemplary method 500 is provided by way of example, as there are a variety of ways to carry out the method. The method 500 shown in FIG. 5 can be executed or otherwise performed by one or a combination of various systems. The method 500 is described below may be carried out by the system and networks shown in FIGS. 1-4, by way of example, and various elements of the system and network are referenced in explaining the exemplary method of FIG. 5.

Each block shown in FIG. 5 represents one or more processes, methods, or subroutines carried out in the method 500 and the steps are not limited to the order depicted in the figure.

Beginning at step 502, the method 500 for providing additional diagnostic and/or repair information when a tested component passes the diagnostic test may begin. At step 504, information associated with the tested components is received. For example, a problem or a failure of a vehicle may arise and an alternator and/or a starter motor may be tested to determine whether it is operating properly. Next, the alternator and/or the starter motor may be taken to the tester 100 for diagnostic test. The information associated with the alternator and/or the starter motor to be tested is then inputted into the tester 100 manually via the monitor screen 123, scanned in through the bar code reader 318, read by RFID reader 332 or communicated by the diagnostic tool 336. For example, a user may manually input the parts number, model, make, year and/or any other information associated with the alternator or starter motor via the monitor screen 123. Alternatively, the information associated with the tested components may be automatically received. For example, the bar code reader 318 and RFID reader can scan/read the alternator or the starter motor to be tested to identify parts number, model, make, year and/or other information associated with the alternator or starter motor. The bar code reader 318 and/or the RFID reader 332 then transmit the information associated with the alternator or the starter motor to the tester 100 via the RS-232 ports 316. Also, the information associated with the alternator or the starter may also be transmitted to the alternator and starter tester 100 via the diagnostic tool 336. After receiving information associated with the test components, the method 500 proceeds to step 506.

As illustrated at step 506, diagnostic test is performed. For example, diagnostic tests may be performed on the alternator and/or starter motor by the tester 100. During this step, the tester 100 performs diagnostic test to determine whether the alternator and/or the starter motor is operating properly and store this information on the internal memory 308 or the external memory 310. The tester 100 next compares the detected test result with the diagnostic test results stored in the internal memory 308 or the external memory 310 and determines whether the tested alternator or the starter motor is operating properly. In the event that the alternator or the starter motor passes the diagnostic test, the method 500 proceeds to step 510. In the event that the alternator or the starter motor fails the diagnostic test, the method 500 then proceeds to step 508.

Moving to step 508, the tester 100 determines whether the alternator or starter motor is the cause of failure or problem in the vehicle when the alternator or starter motor fails the diagnostic test. At step 510, failure identification information of the problem or failure of the vehicle is received, providing the user with potential alternative causes of the problem due to the alternator or starter motor passing the diagnostic test. For example, the user may manually input the failure identification information via the LCD screen 302 such as the diagnostic trouble code (DTC) associated with the problem or failure of the vehicle. In another exemplary embodiment, the user may input symptoms (e.g., engine will not start or battery is not charged) associated with the problem or failure of the vehicle.

In yet another embodiment, the failure identification information may be automatically received by the tester 100. For example, the diagnostic tool 336 may be coupled to the tester 100 and the diagnostic tool 336 may automatically provide the diagnostic trouble code (DTC) to the tester 100. Also, the LCD screen 302 may present the user with a plurality of symptoms of a plurality of problems or failures of the vehicle. The user may then select a symptom that corresponds to the problem or failure experienced by the user.

Moving to step 512, additional information may be queried. The tester 100 may query for additional information based at least in part on the failure identification information. For example, the tester 100 may generate a query message based in part on the failure identification information (e.g., a diagnostic trouble code (DTC) and/or symptoms of the problem or failure of the vehicle). In an exemplary embodiment, the diagnostic trouble code (DTC) interpreter 338 queries the internal memory 308 that stores the plurality of diagnostic trouble codes (DTC) in order to identify diagnostic or repair information associated with the diagnostic trouble code (DTC). In another exemplary embodiment, the diagnostic trouble code (DTC) interpreter 338 queries the external database 310 that stores a plurality of diagnostic trouble codes (DTC) in order to identify diagnostic or repair information associated with the diagnostic trouble code (DTC). In other exemplary embodiments, the diagnostic trouble code (DTC) interpreter 338 provides the diagnostic trouble code (DTC) to a third party via the Internet 322 in order to identify diagnostic or repair information associated with the diagnostic trouble code (DTC).

Also encompassed in the embodiments disclosed herein, the interface module 324 may query technical service bulletins (TSB) 334 via the Internet 322. For example, the interface module 324 can query the technical service bulletins (TSB) 334 based at least in part on a symptom associated with the problem or failure of the vehicle. The interface module 324 compares and contrasts the symptoms associated with the problem or failure of the vehicle with the information (e.g., problems or failures) provided in the technical service bulletins (TSB) 334 when carrying out this step. For example, the interface module 324 identifies diagnostic and/or repair information associated with symptoms related to the problem or failure of the vehicle identified via the technical service bulletins (TSB) 334. After querying for additional information associated with the cause of problem or failure of the vehicle, the method 500 proceeds to step 514.

Moving to step 514, receiving additional information associated the problem or failure of the vehicle is received. The tester 100 receives additional information associated with the problem or failure of the vehicle and provides the additional information to the user. This information is provided from the internal memory 308, the external memory 310 or the technical service bulletins (TSB) 334. The LCD screen 302 displays the additional information to the user. In another exemplary embodiment, the printer 314 may print out the additional information for the user which includes diagnostic and/or repair information that may include diagnostic and/or repair procedures that may be associated with the problem or failure of the vehicle. The diagnostic and/or repair information may be specific to the vehicle or components of any vehicle based diagnostic trouble code (DTC) code, symptom or other diagnostic information.

Also, the diagnostic and/or the repair information may be based on previous diagnostic and/or repair experience for that diagnostic trouble code (DTC) and provides various levels of reported fixes. The diagnostic and/or repair information includes information from technical service bulletins (TSB) hosted by various entities. For example, the diagnostic and/or repair information includes technical service bulletins (TSB) provided by original equipment manufacturers (OEMs) and/or third party that may provide diagnostic and/or repairs to various problems or failures of a vehicle. After receiving additional information related to a cause of problem or failure of a vehicle, the method 500 may end at step 516.

The many features and advantages of the present disclosure are apparent from the detailed specification, and thus, it is intended by the appended claims to cover all such features and advantages of the present disclosure, which fall within the true spirit, and scope of the present disclosure. Further, since numerous modifications and variations will readily occur to those skilled in the art, it is not desired to limit the present disclosure to the exact construction and operation illustrated and described, and accordingly, all suitable modifications and equivalents may be resorted to, falling within the scope of the present disclosure.

What is claimed is:

1. An alternator/starter tester for testing a performance of a component of a vehicle, comprising:
    a processor configured to process test information from an alternator component of the vehicle and control and activate the alternator component to be tested by the alternator/starter tester;
    a memory configured to store the test information of the alternator component and software that operates the alternator component of the vehicle;
    an interface module configured to receive additional repair procedure information to repair the vehicle when the alternator component passes the test; and
    a diagnostic trouble code (DTC) interpreter configured to interpret diagnostic trouble codes to provide the additional repair procedure information, wherein the additional repair procedure information is related to the performance of a different vehicle component from the alternator component and a starter motor, and wherein the memory and the interface module are in communication with the processor.

2. The tester of claim 1, wherein said processor is also configured to control and activate the starter motor component of the vehicle and process starter motor information.

3. The tester of claim 1, wherein the additional repair procedure information is from at least one of a plurality of technical service bulletins.

4. The tester of claim 3, wherein the plurality of technical service bulletins comprises procedures for diagnostic and/or repairing various components of vehicles hosted by original equipment manufacturers.

5. An alternator/starter tester for testing a performance of a component of a vehicle, comprising:
    a processor configured to process test information from a starter motor component of the vehicle and control and activate the starter motor component be tested by the alternator/starter tester;
    a memory configured to store the test information of the starter motor component and software that operates the starter motor component of the vehicle;
    an interface module configured to receive additional repair procedure information to repair the vehicle when the starter motor component passes the test; and
    a diagnostic trouble code (DTC) interpreter configured to interpret diagnostic trouble codes to provide the additional repair procedure information, wherein the additional repair procedure information is related to the performance of a different vehicle component from the starter motor component and an alternator component, and wherein the memory and the interface module are in communication with the processor.

6. The tester of claim 5, wherein said processor is also configured to control and activate the alternator component of the vehicle and process alternator component information.

7. The tester of claim 5, wherein the additional information is from at least one of a plurality of technical service bulletins.

8. The tester of claim 7, wherein the plurality of technical service bulletins comprises procedures for diagnostic and/or repairing various components of vehicles hosted by original equipment manufacturers.

9. A method of testing of a component of a vehicle with an alternator/starter tester, comprising the steps of:
    activating, with a processor of the alternator/starter tester, an alternator component to generate test information;
    processing, with the processor, the test information from the alternator component of the vehicle;
    receiving the test information associated with the alternator component of the vehicle via an input device;
    performing, with the processor, a diagnostic test on the alternator component;
    receiving, with an interface module of the alternator/starter tester, information resulting from the diagnostic test indicating pass or fail of the diagnostic test by the alternator component;
    interpreting diagnostic trouble codes by a diagnostic trouble code interpreter to provide additional repair procedure information when the alternator component passes the test;
    querying a memory of the alternator/starter tester by the interface module for additional repair procedure information regarding a different vehicle component from the alternator component and a starter motor when the alternator component passes the test; and
    receiving the additional repair procedure information by the interface module.

10. The method according to claim 9, further comprising the steps of:
    activating the starter motor component to generate test information; and performing a diagnostic test on the starter motor component.

11. The method according to claim 9, wherein the additional information is from at least one of a plurality of technical service bulletins.

12. The method according to claim 11, wherein the plurality of technical service bulletins comprise procedures for diagnostic and/or repairing various components of vehicles hosted by original equipment manufacturers.

13. A method of testing of a component of a vehicle with an alternator/starter tester, comprising the steps of:
    activating, with a processor of the alternator/starter tester, a starter motor component to generate test information;
    processing, with the processor, the test information from the starter motor component of the vehicle;
    receiving the test information associated with the starter motor component of the vehicle via an input device;
    performing, with the processor a diagnostic test on the starter motor component;
    receiving, with an interface module of the alternator/starter tester, information resulting from the diagnostic test indicating pass or fail of the diagnostic test by the starter motor component;
    interpreting diagnostic trouble codes by a diagnostic trouble code interpreter to provide additional repair procedure information when the starter motor component passes the test;
    querying a memory of the alternator/starter tester by the interface module for additional repair procedure regarding a different vehicle component from the starter motor component and an alternator component when the starter motor component passes the test; and receiving the additional repair procedure information by the interface module.

14. The method according to claim 13, further comprising the steps of:

activating the alternator component to generate test information and performing a diagnostic test on the starter motor component.

15. The method according to claim 13, wherein the additional information is from at least one of a plurality of technical service bulletins.

16. An alternator/starter tester for testing the performance of a component of a vehicle, comprising:

means for processing test information from an alternator component or a starter motor of the vehicle, the means for processing controlling and activating the alternator component or the starter motor to be tested by the alternator/starter tester;

means for storing the test information of the alternator component or the starter motor component and software that operates the alternator component or the starter motor component of the vehicle;

means for providing information configured to receive additional repair procedure information when the alternator component or the starter motor component passes the test; and a diagnostic trouble code (DTC) interpreter configured to interpret diagnostic trouble codes to provide the additional repair procedure information, wherein the additional repair procedure information is related to the performance of a different vehicle component from the alternator component and the starter motor component, and wherein the means for storing and the means for providing are in communication with the means for processing.

* * * * *